United States Patent
Ishizuka

(10) Patent No.: US 7,319,940 B2
(45) Date of Patent: Jan. 15, 2008

(54) METHOD FOR MANAGING SEMICONDUCTOR CHARACTERISTIC EVALUATION APPARATUS AND COMPUTER PROGRAM THEREFOR

(75) Inventor: Koji Ishizuka, Tokyo (JP)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 11/333,463

(22) Filed: Jan. 17, 2006

(65) Prior Publication Data

US 2006/0195298 A1 Aug. 31, 2006

(30) Foreign Application Priority Data

Feb. 25, 2003 (JP) .............................. 2005-051212

(51) Int. Cl.
 *G06F 17/40* (2006.01)
 *G06F 15/00* (2006.01)
(52) U.S. Cl. ................................... 702/187
(58) Field of Classification Search ............... 702/187, 702/119, 123
 See application file for complete search history.

(56) References Cited

U.S. PATENT DOCUMENTS

| 5,206,582 | A | 4/1993 | Ekstedt et al. |
| 5,768,144 | A | 6/1998 | Nagase |
| 6,418,391 | B1* | 7/2002 | Umezu et al. ............. 702/123 |
| 6,744,266 | B2* | 6/2004 | Dor et al. ................. 324/751 |
| 2002/0161532 | A1* | 10/2002 | Dor et al. ..................... 702/35 |
| 2003/0036875 | A1* | 2/2003 | Peck et al. ................. 702/127 |
| 2005/0121612 | A1* | 6/2005 | Okuda et al. ............... 250/311 |

FOREIGN PATENT DOCUMENTS

| EP | 1 156 431 | 11/2001 |
| GB | 2 352 058 | 1/2001 |
| JP | 08-122411 | 5/1996 |

OTHER PUBLICATIONS

European Search Report for European Patent Application No. 06101154.0, Jun. 20, 2006.

* cited by examiner

*Primary Examiner*—Bryan Bui
(74) *Attorney, Agent, or Firm*—Marc Bobys

(57) ABSTRACT

A management method for data in a semiconductor characteristic evaluation apparatus comprised of a control unit, a memory unit, and input/output units includes steps for selecting the workspace including the test programs for testing a plurality of wafer types, for storing the test results in the selected workspace as histories, and for searching for the desired test results from the histories of the stored test results.

1 Claim, 6 Drawing Sheets

METHOD FOR MANAGING SEMICONDUCTOR CHARACTERISTIC EVALUATION APPARATUS AND COMPUTER PROGRAM THEREFOR

FIELD OF THE INVENTION

The present invention relates to a semiconductor characteristic evaluation apparatus and relates to managing the evaluation and measurement computer programs and data in the development and fabrication of semiconductors in the wafer stage.

DISCUSSION OF THE BACKGROUND ART

In the development and fabrication of semiconductor elements, a semiconductor characteristic evaluation apparatus such as the semiconductor parametric testing apparatus according to Unexamined Japanese Patent Publication No. [Kokai] H2[1990]-56947 is employed for wafer process management. Naturally, the wafer management process is important in the mass production of semiconductor elements such as integrated circuits and preferably accumulates and establishes knowledge from the development stage of the semiconductor elements in order to smoothly move to mass production. For the wafer fabrication process, the introduction of 300-mm wafers at various companies in 2004 comes to mind. However, the development of new processes must always continue in order to further evolve each year.

For simplicity, in this specification, the development of semiconductor elements accompanying wafer process management is referred to as "wafer development".

The simple example in FIG. 5 is used to explain parametric testing during wafer development. In FIG. 5, Project A (400) indicates the transitions in a series of various computer programs and various data types for wafer development. The development stage of a wafer in the project is divided into Phase 1 (401), Phase 2 (411), and Phase 3 (421) which develop wafers (402) of wafer type A1, wafers (410) of wafer type A2, and wafers (420) of wafer type A3, respectively. The wafer type refers to the type of wafer in the trial manufacture in each phase and is discriminated by the type and quantity of the device under test (DUT) formed on the wafer. The wafer type is almost the same type as in the phase, but the type sometimes changes slightly as the number of trial manufactures in a phase advances.

As an example, in the case considered, the object of Project A is to add a test element to the wafer for a new evaluation item. In Phase 1, as the initial stage, the basic shape of the test element is made and evaluated. In Phases 2 and 3, the basic shape is slightly changed and evolved, and finally the test element is completed on the wafer.

In each phase, the computer programs and data of a conventional parametric test are considered. In Phase 1, a plurality of wafer type A1 (402) prototype wafers is fabricated. Test program PA1 (404) and setup data therefor or parameter setup data SA1 (406) are created for the test. The resulting test result RA1 (408) is produced from the test results of each prototype wafer and stored. Similarly, in Phase 2, a plurality of wafer type A2 (410) prototype wafers is fabricated. Test program PA2 (412) and setup data SA2 (414) are created. Test result RA2 (416) is produced and stored. In Phase 3, a plurality of wafer type A3 (420) prototype wafers is fabricated. Test program PA3 (422) and setup data SA3 (424) are prepared for testing. Test result RA3 (426) is produced and stored.

In the past, these computer programs, setup data, and results were each assigned a file name by a user, and saved on floppy disks (registered trademark) or hard disks. However, if the user did not pay attention to the file names, there was the danger that computer programs and setup data previously created were overwritten. Furthermore, finding the computer programs and setup data used in other projects, and finding the test results of other projects for comparison with the newest test results were difficult procedures. These searches were the responsibility of management by all of the users. Therefore, each user entered the file name following a detailed rule and was required to manage his own notation fields for saving the attributes set for each file.

The setup data saved in each phase are overwritten unless the file name is intentionally changed and the data copied. The setup data used in the test of the first wafer trial fabrication of some phases are not kept even if using that data is preferred.

In other words, in the complex processes of semiconductor development and fabrication by a plurality of projects as described above, it was not easy for the users to manage the projects in order to enable the reuse of various computer programs, setup data, and test results.

The simple example in FIG. 5 was explained. However, in actual wafer development, a plurality of various types of DUTs is sometimes formed on one wafer. A plurality of test programs is prepared, and these programs include test programs used in a plurality of all types of DUTs. One test program is executed by using a plurality of setup data, and the number of measurement data becomes huge. In this complex situation, it is extremely difficult to provide management in order to enable the users to reuse various computer programs, setup data, and test results.

SUMMARY OF THE INVENTION

An object of the present invention is to solve the problem described above and propose a test apparatus and a method therefor to easily manage and reuse various test programs and various data types (setup data and test result data) of a semiconductor characteristic evaluation apparatus, such as in semiconductor parametric tests, in wafer development across a plurality of projects.

Another object of the present invention is to propose a computer program that easily manages the test programs and various data of the semiconductor characteristic evaluation test in wafer development as described above.

Another object of the present invention is to offer an evaluation apparatus and a computer program therefor for collecting the test programs and various data types of a plurality of projects in a unit called a workspace in order to manage the life cycle of wafer development.

Another object of the present invention is to offer an evaluation apparatus and a computer program therefor capable of preventing the loss of data by unintentional overwrites by differentiation based on the work content or the access rights of the users in the unit referred to as the workspace.

The management method according to the present invention is a data management method in a semiconductor characteristic evaluation apparatus comprising a control unit, a memory unit, and input/output units, and includes steps for selecting a workspace including test programs for testing a plurality of wafer types, for logging the history and for storing the test results in the selected workspace, as well as for searching for the desired test result from the histories of stored test results.

Furthermore, the management method according to the present invention comprises steps for storing the setup data as the history in the selected workspace and for searching for the desired setup data from the history of stored setup data.

Furthermore, another management method according to the present invention includes a step for storing the test result, a step for searching for this test result, a step for storing these setup data, and a step for searching for these setup data for a plurality of wafer types.

Furthermore, another management method according to the present invention includes the step for searching for this test result by searching for the date and time of the test.

Furthermore, another management method according to the present invention include the step for storing this test result that does not input a file name.

Furthermore, another management method according to the present invention has a workspace that includes test programs for testing a plurality of wafer development projects.

Furthermore, the computer program according to the present invention executes any one of the above management methods.

From the above, if the present invention is used, various test programs and data types in the wafer development life cycle across a plurality of projects are easily managed, the loss of test programs and various data types by careless overwriting can be avoided, and searching for past test programs and various data types becomes easy. Therefore, these test programs and various data types become easy to reuse, and the time and cost of wafer development can be reduced.

DETAILED DESCRIPTION OF THE PREFERRED EMBODIMENT

Figure 1:
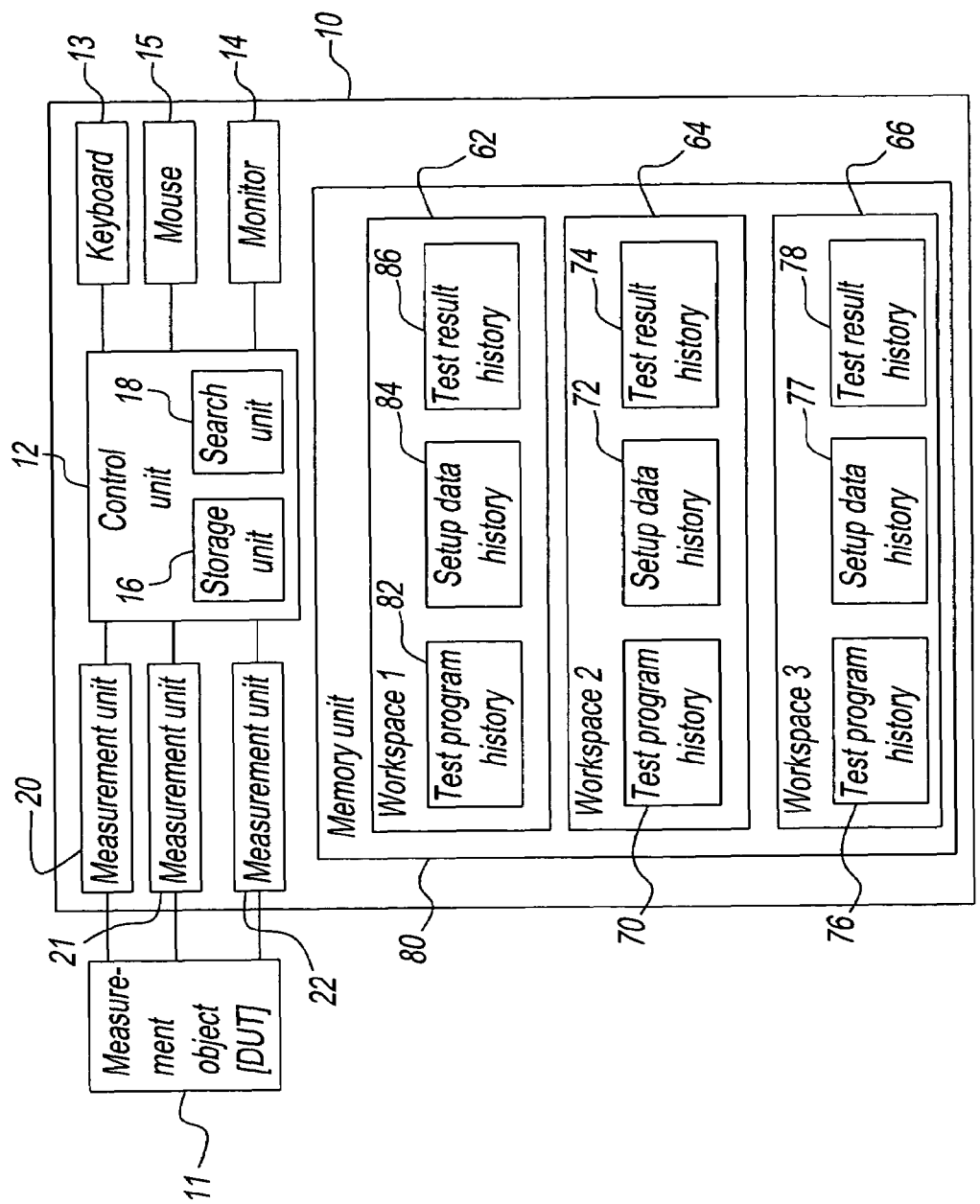
FIG. 1 is a block diagram showing an embodiment according to the present invention.

Referring to FIG. 1, a semiconductor characteristic evaluation apparatus 10 based on a preferred embodiment of the present invention is explained. The semiconductor characteristic evaluation apparatus 10 comprises various measurement units (20, 21, 22) connected by a plurality of pins in a device under test (DUT) 11 on the wafer. Each measurement unit 20-22 is connected to a control unit 12. The control unit 12 is connected to the input and output units such as a keyboard 13, a mouse 15, and a monitor 14. The control unit 12 follows the input from an input device such as the keyboard 13 or mouse 15, or a test program stored in a memory unit 60, or the setup data when executing the test program to control each measurement unit 20-22, to obtain the test result, and to store the test result in the memory unit.

A storage unit 16 and a search unit 18 are provided in the control unit 12. The storage unit 16 provides functions for storing test programs, setup data, and test results in the memory unit 60. The search unit 18 provides functions for searching for test programs, setup data, and test results in the memory unit 60. A computer such as a personal computer (PC) loaded with the Windows (registered trademark) operating system (OS), for example, can be used for the control unit 12, memory unit 60, keyboard 13, mouse 15, and monitor 14.

Various computer programs and various data can be stored for a plurality of workspaces in the memory unit 60. FIG. 1 illustrates the three workspace areas of workspace 1 (62), workspace 2 (64), and workspace 3 (66). Each workspace can manage various computer programs and various data covering a plurality of projects. Workspace 1 (62) can be comprised of a test program history area 82 for storing the history of various test programs related to this workspace, a setup data history area 84 for storing the history of the setup data related to test programs of this workspace, and a test result history area 86 for storing the history of the results of tests related to this workspace. These three history areas (82-86) can store various computer programs and various data covering a plurality of projects, or can store various computer programs and various data covering a plurality of wafer types. Therefore, this does not mean that computer programs and data are stored discriminated by project name in this workspace, but computer programs and data covering a large number of projects are mixed and stored in each history area.

It should be noted that the representation of "history" in this specification is an accumulation of computer programs or data stored without the user explicitly specifying a file name and is not a list holding the objectives of changes or descriptions of the purpose. For example, test program history area 82 stores each version of the test programs used in tests of the wafer type belonging to workspace 1 (62) and test programs that the user wanted to save. Setup data history area 84 stores each version of the setup data used by the test programs belonging to workspace 1 (62) and the setup data that the user wanted to save. Test result history area 86 stores all of the test results of tests executed in relation to workspace 1 (62).

It should be noted that when the user wants to save a new version of a computer program or data for a computer program or data stored in each history area, the save is performed while a copy is made of the previous version of the computer program or data, and the previous version is not overwritten. The entire computer program or data to be saved can be the form saved, or a compressed form for managing the difference can be saved. When the user wishes to save a new version of the test program or the setup data, the user can give a title or a name that is not the file name of the new version and save. In this case, note that the title has very few format constraints except for the file name.

The test result history area 86 accumulates the results of each test execution in workspace 1 (62). Also in this case, without the user specifying the save file name at the time of the test execution, the test results can be automatically stored in the memory unit 60 from the storage unit 16. The user selects the desired items from the history of the test results and can display or run an evaluation. In this history of test results, the test results covering a plurality of projects or wafer types can be stored. The test results for a plurality of times can be accumulated for a plurality of types or a plurality of DUTs. For example, each test result is stored in the history when the measurement was made after a "trial" measurement for some DUT.

In the test program history 82, the user can save while creating a copy of each version of a test program by assigning a title, which is not the file name, to the test program and saving.

Furthermore, the test program history (70), setup data history (72), and test result history (74) related to workspace 2 are stored in area 64 of workspace 2. Similarly, the test program history (76), setup data history (77), and test result history (78) related to workspace 3 are stored in area 66 of workspace 3.

Figure 4:
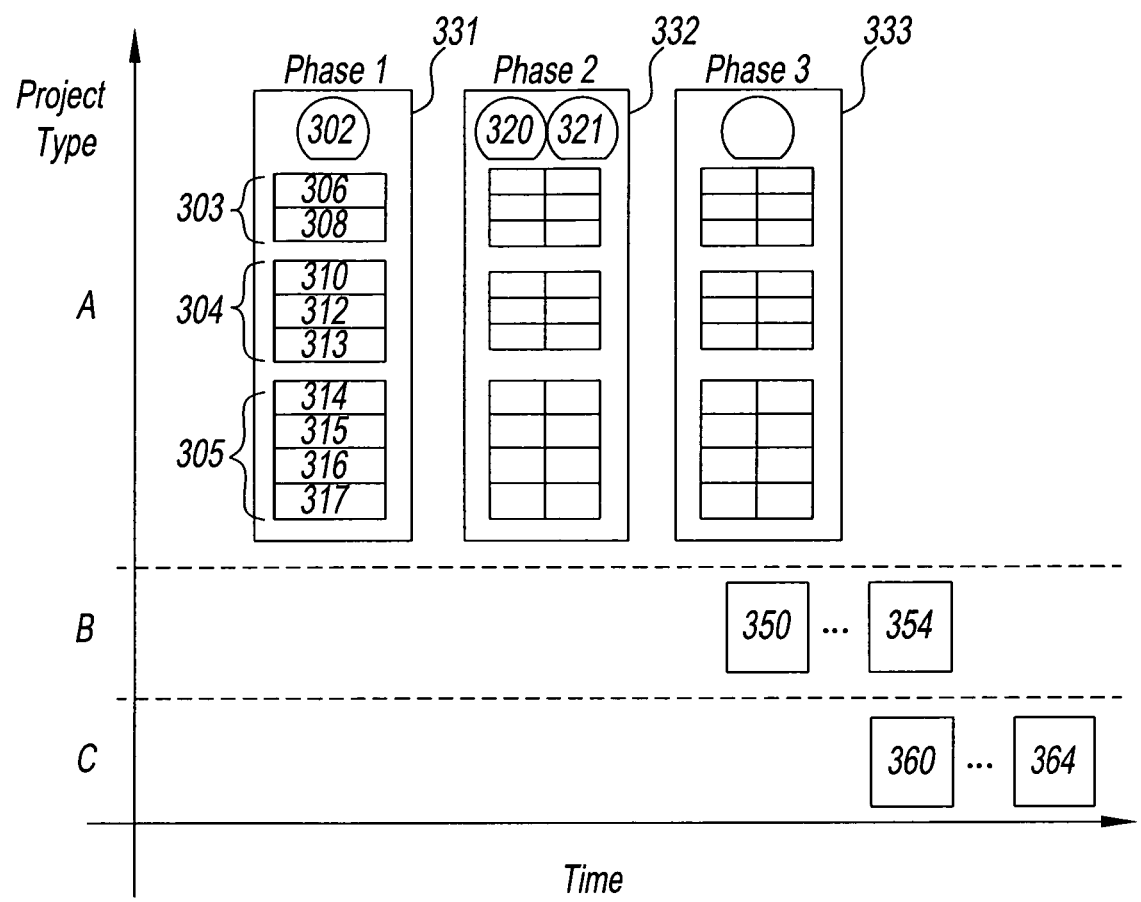
FIG. 4 is a drawing showing the wafer development process for explaining the effects of the workspace according to the present invention.
Figure 5:
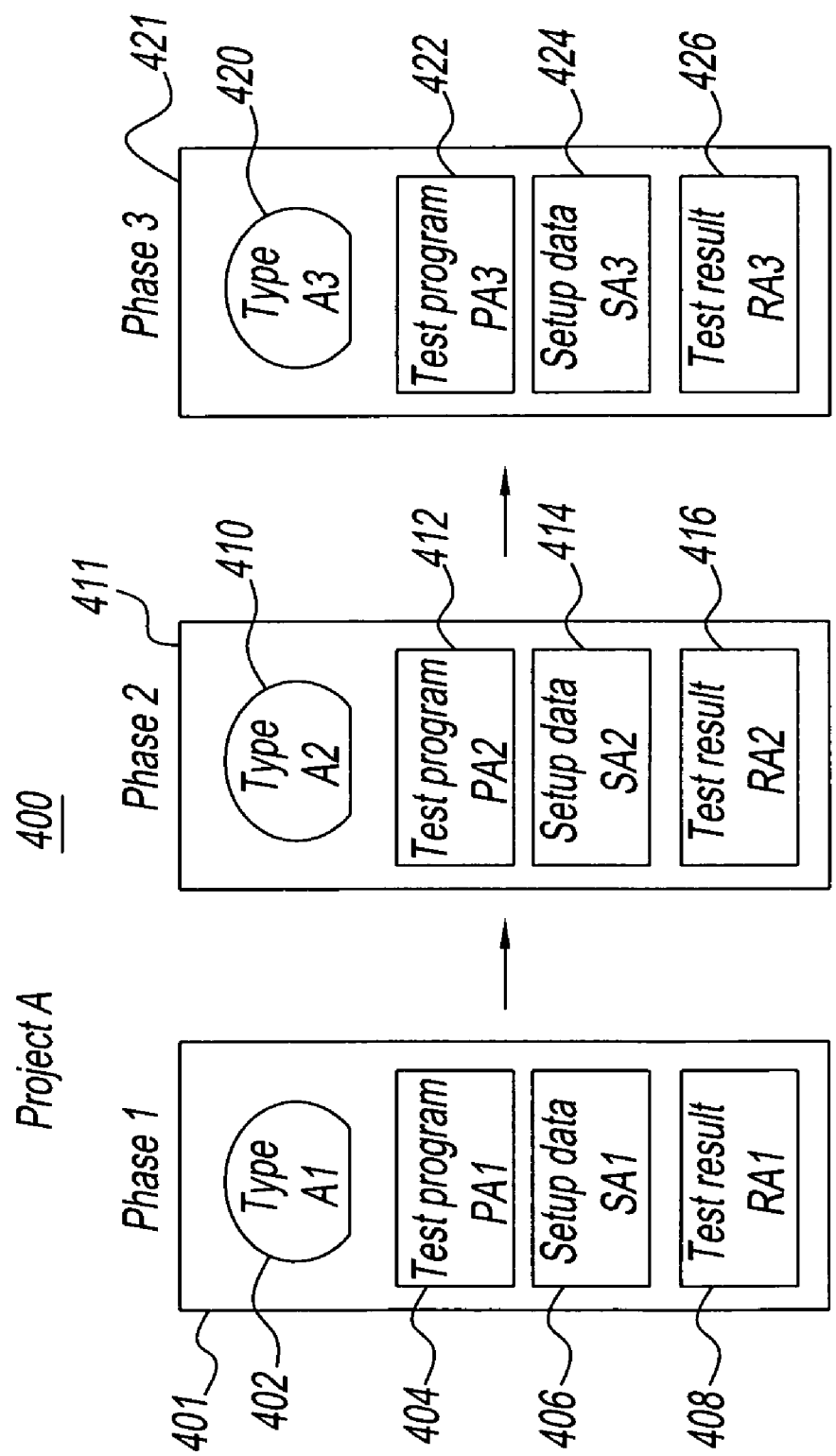
FIG. 5 is a drawing showing the development process in project management by conventional technology.

Next, referring to FIG. 4, the relationships among the project, wafer type, various computer programs, and various data managed as one workspace in an embodiment of the present invention are explained. FIG. 4 shows the elapsed time on the horizontal axis and the type of project on the vertical axis, and illustrates the transition of the project seen from the wafer development life cycle.

In FIG. 4, from the above, the wafer type, test program, setup data, and test result are shown, in particular, for each phase of Project A. The numbers are entered to enable conceptual understanding.

First, the explanation focuses on Project A. The prescribed prototype wafers of wafer type (302), which is in Phase 1 (331), are fabricated. The two test programs indicated by 306 and 308 are prepared as the test program (303) to be used. The setup data 304 used by these test programs (303) are prepared as the three sets of 310, 312, and 313. The results of the four sets of 314, 315, 316, and 317 are accumulated as the corresponding test result (305).

Next, in Phase 2 (332), the development aim is changed during the phase, the prescribed wafers of the two wafer types 320 and 321 are fabricated, and the test program and the setup data applied to these wafer types must be created, and the test results are accumulated. The same items for the DUTs in the wafer types of Phase 1 are sometimes used for the DUTs in the wafer types of Phase 2. In this case, the same objects as Phase 1 are used in the test program and setup data of Phase 2.

In Phase 3 (333), the prescribed wafers of one wafer type are fabricated. The test programs and setup data required for the test of this wafer type are prepared. The corresponding test results are accumulated.

Next, when Project B is examined, Phase 1 (350) of Project B is started at the same time when Phase 3 of Project A starts. The test programs and setup data until Phase 2 of Project A are also used. In this case, the test programs and setup data created in the previous Project A in the present invention can easily be used in the tests in Project B by searching by the search unit 18 in FIG. 1 from the screen (FIG. 2) shown on the monitor 14, to be described later. When the test results of the reused test programs are examined, the test results of the same test programs can be searched for in the test results of Project A by the search unit 18 in FIG. 1 in the present invention. Comparisons can easily be made, for example, on whether a negative trend in the current test results occurred previously.

Furthermore, Project B reaches the last phase (354) and the project ends. Then Phase 1 (360) of Project C is started and is executed until the last phase (364). Needless to say, in either phase of Project C, the search unit 18 of the present invention can be used and can easily search for the computer programs or the data corresponding to Project A or Project B.

In a conventional semiconductor characteristic evaluation apparatus, the user was responsible for managing, and conducted reviews and improvements from the wafer development life cycle. For example, in Phase 1 (331) of Project A, two test programs are created, three setup data sets are used, and four sets of test results are kept. In the setup data, only a small content may be changed. According to the present invention, even if the user does not explicitly assign a file name, the history can be easily kept. In addition, the contents are kept as a complete set of setup data. For example, the setup data used in Phase 1 of Project B easily uses the previous version of the final version of the setup data used in Phase 2 of Project A. The test results are also saved without the user assigning a file name, including multiple results on repeating the same tasks, therefore, it can be easily analyzed for defect portions of the results.

In the present invention, the management of a series of projects in wafer development or the computer programs and data related to a plurality of wafer types can be handled as events in the same workspace and the advantages described above can be achieved.

Figure 2:
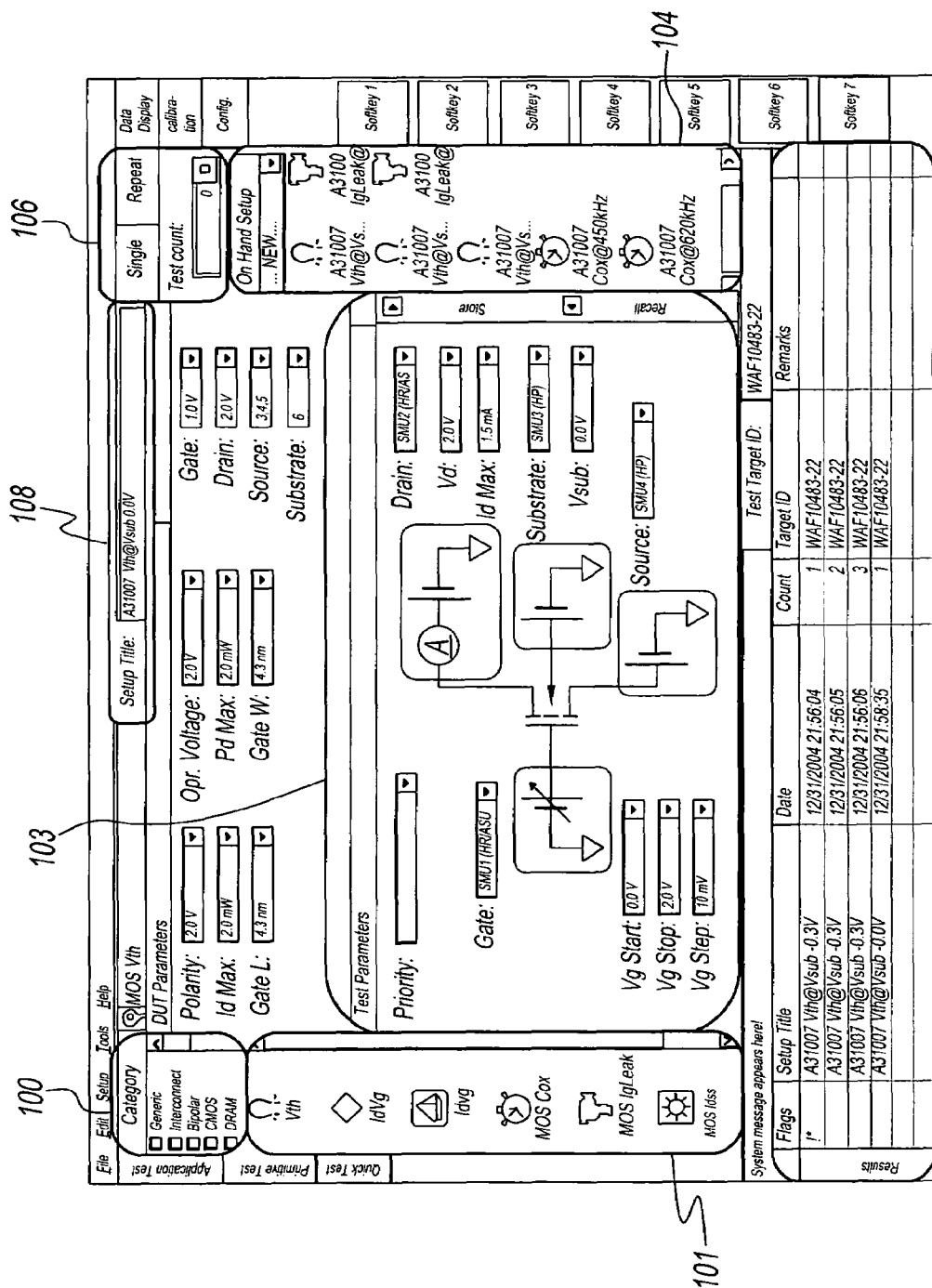
FIG. 2 is a schematic illustrating the execution screen of the semiconductor characteristic evaluation apparatus according to an embodiment of the present invention.

Next, referring to FIG. 2, the management of the setup data and test result histories are explained in an embodiment according to the present invention. FIG. 2 illustrates the execution environment of the test displayed on monitor 14 in the embodiment according to the present invention in the state where some work group was selected, and the test program MOS Vth was selected. Category 100 is the segment for selecting the technical field of the test program. The enclosed segment below indicated by reference number 101 is the segment for selecting the test program (also referred to as the application) in the selected technical field.

The screen region where the setup data corresponding to the selected test program are formed is the enclosed area indicated by 103. This area 103 is displayed by selecting the test program. The parameters can be set by entering or selecting the desired setup data, that is, the parameters, in each field in this area. The title of the setup data is displayed in the field indicated by 108. To store the setup data of one set in the history, the Store button on the right end of the enclosed segment indicated by reference number 103 is clicked. The file name does not have to be entered when storing. When the Store button is clicked, the setup data displayed in area 103 are added and displayed as an icon in the icon list segment of the On Hand Setup of area 104. In area 104, three sets of history have already been saved as the setup data related to the computer program of Vth. Consequently, the setup data can be saved by just clicking the Store button of area 103.

The test is executed in the segment enclosed by area 106. For example, if the Single button is clicked, the test program is executed only one time. The desired number of repetitions is set in the Test count field. When the Repeat button is clicked, the test program can be repeatedly executed the desired number of times.

The test results are listed as the execution history of the test in the segment enclosed by area 102. The title of the setup data (Setup Title), the execution time (Date), the number of executions (Count), the ID of the measurement object called the Target ID, and the field for writing notes called Remarks are displayed for discriminating the test results. By clicking the desired heading, the display can change to a sorted display of the heading content. The test results are automatically stored by executing the test program. The user does not have to specify a file name each time, and the desired test results can be discriminated and selected based on, for example, the date. When discrimination is difficult, hints about the discrimination are entered under Remarks. Various flags can be easily set in the Flags field. The corresponding test program names and setup data names are linked and stored in the test results, and repeating the execution becomes simple.

As can be understood from the above explanation, each project name is not explicitly managed in the embodiment according to the present invention. The user may include the project name in the test program title, setup data title, Target ID, or Remarks. Even if the user did not write the project name in these fields, the desired test result can be discriminated from the content of these fields or the execution times. In other words, items related to a plurality of projects are mixed and displayed if they belong to the same workspace in the history list of the setup data displayed in area 104 or the history list of the test results displayed in area 102. However, the test results can be sorted by date if the display of the list limited to the current project results is desired. If past data will be searched for, discovering these data becomes simple by the appropriate sorting. To avoid complex operations for the user with each save, the user can flexibly respond with simple operations when a search is needed, and the burden on the user is extremely small. These advantages result from the facts that the storage unit 16 does not need a file name input and the search unit 18 is resorted simply by clicking the heading, which items are specific to the present invention, provided by the control unit 12.

Figure 3:
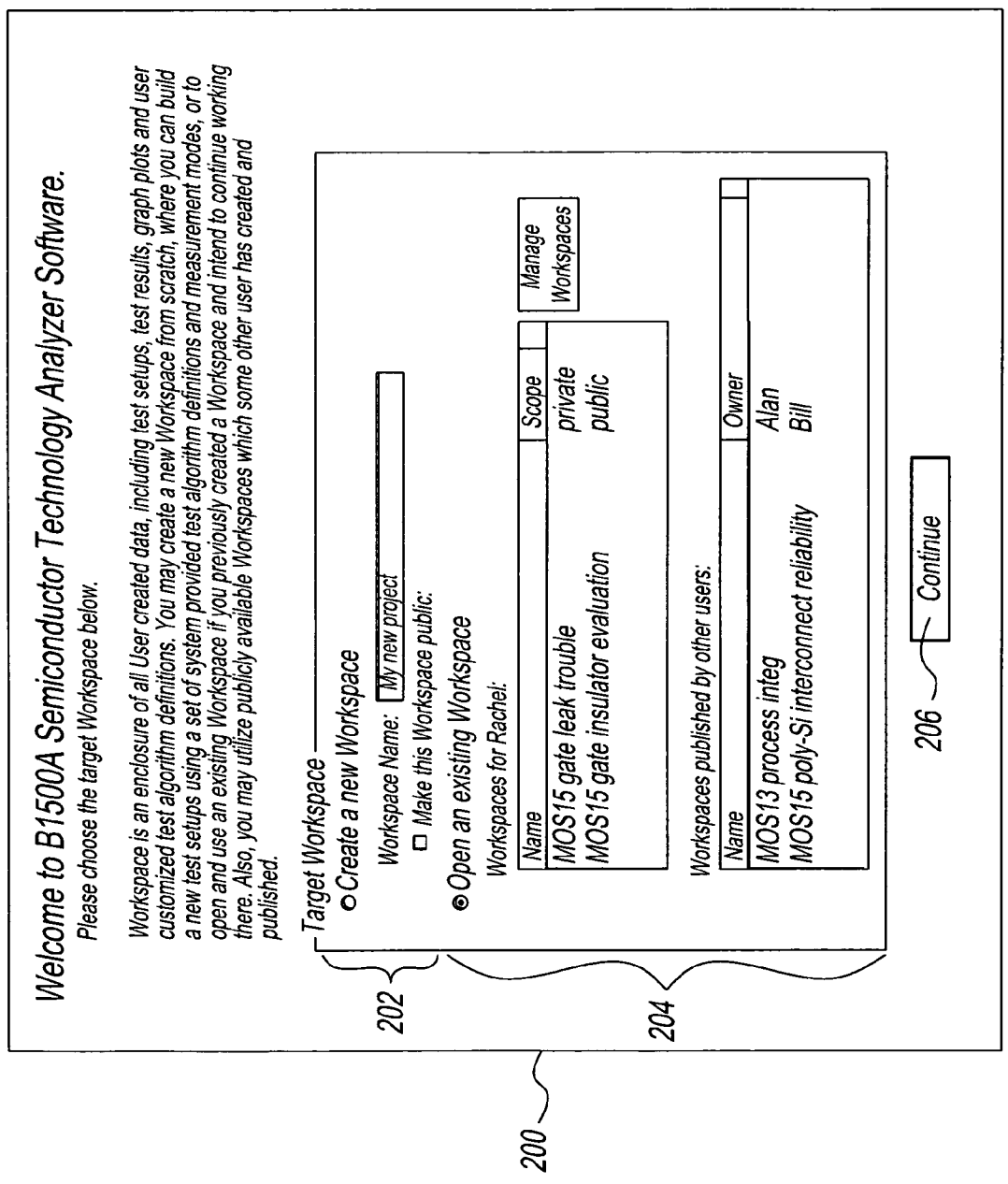
FIG. 3 is a schematic showing the selection screen of the workspace according to an embodiment of the present invention.

Next, referring to FIG. 3, the selection screen 200 of the workspace is shown. When the user starts to use the semiconductor characteristic evaluation apparatus, which is an embodiment according to the present invention, the selection screen 200 of the workspace is displayed, and which operation to start can be selected in any workspace. When a new workspace is created in the frame shown with the Target Workspace, area 202 is selected. When the user selects an existing workspace, the selection is made in area 204. The information in the workspace for each user is displayed, the workspaces of other users that can be used (public) and the workspaces with use restricted to only the owner (private) are also displayed. These settings can be changed. In addition, whether or not a user has permission to use a workspace can be established in advance.

Computer programs and data can be protected from unintentional loss by creating the workspace and selecting the workspace based on the work content related to one user or registering the users allowed to use each workspace for a plurality of users. Because the setup data and the test results cannot be accessed if the workspace is different, mistakenly overwriting the setup data of a project performed a long time ago by some user and mistakenly changing without permission the setup data of a project by an unintended user can be prevented.

Figure 6:
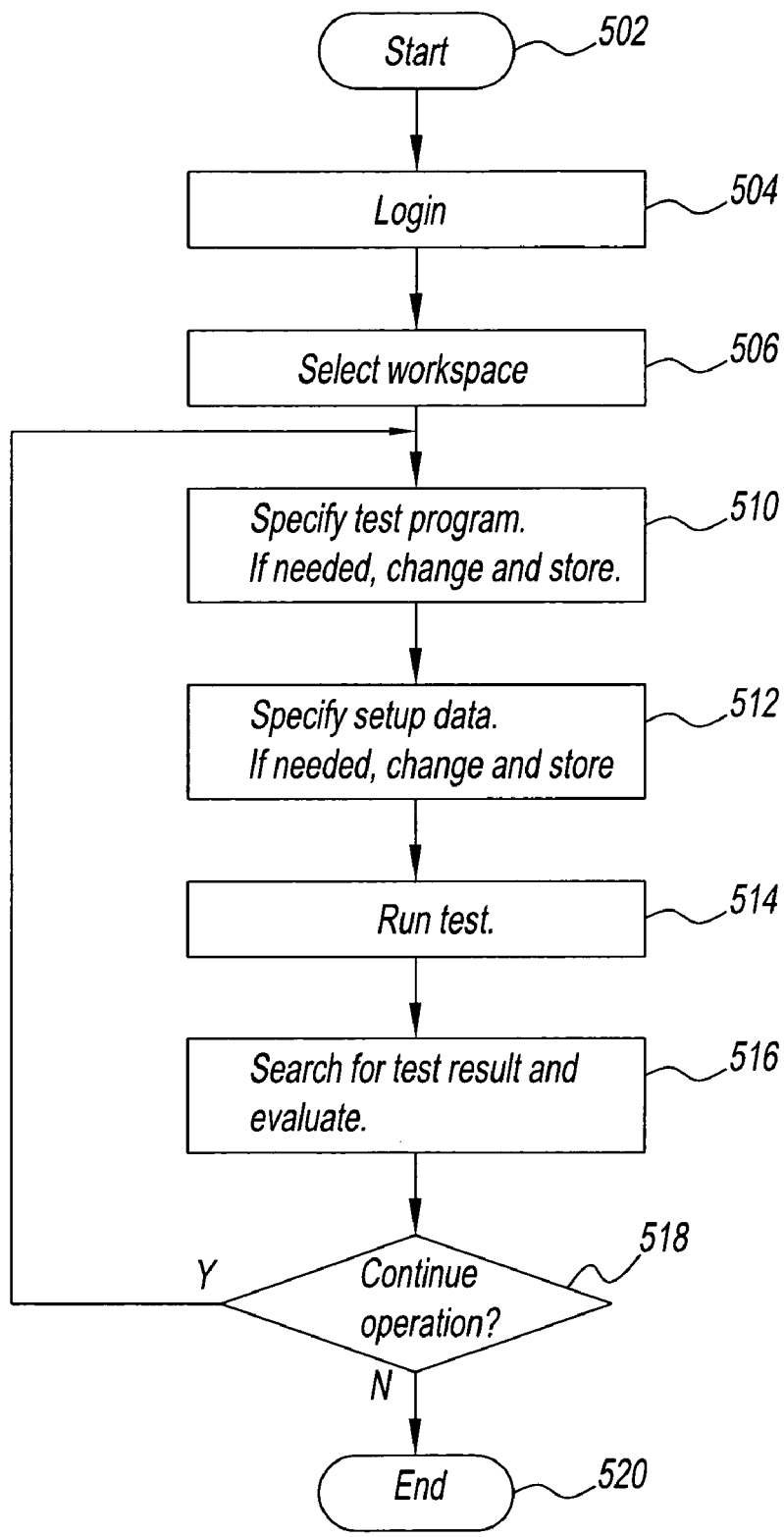
FIG. 6 is a flow chart explaining the management method according to the present

Finally, referring to FIG. 6, an overview of the flow of the management method according to the present invention is explained. First, this computer program starts in Step 502. Next, in Step 504, the user name is used to login. This login can use the login function of the users set in the PC. Step 504 can be omitted. Furthermore, in Step 506, the workspace for working is selected. A new workspace can be created.

Next, in Step 510, the test program for the DUT on the wafer to be tested is specified or selected. If needed, changes are added and stored. At this time, the test program can search for, select, or specify items already stored in the semiconductor characteristic evaluation apparatus. Alternately, a test program can be newly created and that program can be specified.

Next, in Step 512, the setup data used in the execution of the test program are specified or selected, and if needed, changes are added and stored. The setup data are existing data that are searched for and specified, or are newly created and specified, and the same operations applicable to the test program are available.

Next, the test is run in Step 514. The execution can be repeated for some number of times, and the result can be examined and the execution performed again.

Next, in Step 516, the test result is searched for and evaluated. If only this result is searched for and displayed, searching for and comparing with past test results are included in this step.

Next, in Step 518, the decision is made on whether or not to continue to another test. If continue (Y) is selected, a return is made to Step 510. If not (N), one proceeds to Step 520 and the end.

An embodiment according to the present invention was explained above. This embodiment is for illustration, and a person skilled in the art should be able to implement various modifications and changes within the scope of the claims of the present invention. For example, the mouse 15 described above can be replaced by a pointing device such as a track ball, a touch pad, or a touch panel.

What is claimed is:

1. A data management method in a semiconductor characteristic evaluation apparatus, wherein said apparatus comprises a control unit, a memory unit, and input/output units, and wherein said management method comprises the steps of:

selecting a workspace including test programs for testing a plurality of wafer types;
storing test results in said selected workspace as a history;
searching for desired test results from the histories of previously stored test results;
storing a setup data in said selected workspace as history;
searching for a desired setup data from histories of previously stored setup data; and
using said desired setup data in a wafer fabrication process,
wherein said step for searching for the test results searches for the date and time of the test and said step for storing the test results does not input a file name.

* * * * *